(12) United States Patent
Ren et al.

(10) Patent No.: US 10,791,629 B1
(45) Date of Patent: Sep. 29, 2020

(54) PRINTED CIRCUIT BOARD CONFIGURATION TO FACILITATE A SURFACE MOUNT DOUBLE DENSITY QSFP CONNECTOR FOOTPRINT IN A BELLY-TO-BELLY ALIGNMENT

(71) Applicant: Cisco Technology, Inc., San Jose, CA (US)

(72) Inventors: Fanghui Ren, San Jose, CA (US); Liang Xue, Los Altos, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/682,204

(22) Filed: Nov. 13, 2019

Related U.S. Application Data

(60) Provisional application No. 62/896,619, filed on Sep. 6, 2019.

(51) Int. Cl.
| | |
|---|---|
| *H01R 12/55* | (2011.01) |
| *H05K 3/40* | (2006.01) |
| *H05K 1/11* | (2006.01) |
| *H01R 12/57* | (2011.01) |
| *H01R 43/20* | (2006.01) |
| *H05K 1/18* | (2006.01) |

(Continued)

(52) U.S. Cl.
CPC .............. *H05K 1/115* (2013.01); *H01R 12/57* (2013.01); *H01R 43/205* (2013.01); *H05K 1/0216* (2013.01); *H05K 1/181* (2013.01); *H05K 3/303* (2013.01); *H05K 2201/09509* (2013.01); *H05K 2201/09609* (2013.01); *H05K 2201/10189* (2013.01); *H05K 2201/10303* (2013.01)

(58) Field of Classification Search
CPC ........ H01R 12/55; H01R 12/57; H01R 12/58; H01R 12/585; H05K 3/4007; H05K 3/4015; H05K 1/11
See application file for complete search history.

(56) References Cited

U.S. PATENT DOCUMENTS

| | | | |
|---|---|---|---|
| 7,830,223 | B2 | 11/2010 | Ahmad |
| 8,383,951 | B2 | 2/2013 | Morlion et al. |
| 10,244,629 | B1 | 3/2019 | Balasubramanian et al. |

(Continued)

OTHER PUBLICATIONS

TE Connectivity, "QSFP28/56 and zQSFP+ Interconnects", May 2019, 10 pages.

(Continued)

*Primary Examiner* — Jeremy C Norris
(74) *Attorney, Agent, or Firm* — Edell, Shapiro & Finnan, LLC

(57) ABSTRACT

An electronic device includes a printed circuit board (PCB). The PCB includes first and second grids disposed at a top surface and a bottom surface of the PCB, respectively. Each grid includes a plurality of footprint pins, and a plurality of vias extending through the PCB to the top and bottom surfaces. Each footprint pin includes a connecting end and a free end that opposes the connecting end. Each via includes a contact end located at one of grids and is in electrical contact with the connecting end of one of the footprint pins, and each via further includes a non-contact end that is located at the other of the grids and is not in electrical contact with any of the footprint pins. First and second connectors are mounted to the PCB top and bottom surfaces and connect with the footprint pins of the first and second grids.

20 Claims, 12 Drawing Sheets

(51) Int. Cl.
   *H05K 1/02*      (2006.01)
   *H05K 3/30*      (2006.01)

(56) References Cited

U.S. PATENT DOCUMENTS

2019/0150273 A1   5/2019   Charbonneau et al.
2019/0208631 A1   7/2019   Xiong

OTHER PUBLICATIONS

QSFP-DD MSA, "QSFP-DD Hardware Specification for QSFP Double Density 8X Pluggable Transceiver", QSFP-DD MSA, Rev 5.0, Jul. 9, 2019, 82 pages.
TE Connectivity, "OSFP Connectors & Cable Assemblies", TE Connectivity; retrieved from Internet Apr. 30, 2020, https://www.te.com/usa-en/products/connectors/pluggable-connectors-cages/osfp.html?tab=pgp-story, 3 pages.
Broadcom Corporation, "Multirow QFN Soldering Guidelines", Broadcom Corporation, Mar. 3, 2014, Irvine, CA, 30 pages.
II-VI Incorporated, "Pluggable Optics for the Data Center", II-VI Incorporated, Jan. 2020, www.ii.vi.com, 6 pages.
Intel, "AN 114: Board Design Guidelines for Intel Programmable Device Packages", Intel, Dec. 31, 2019, 35 pages.

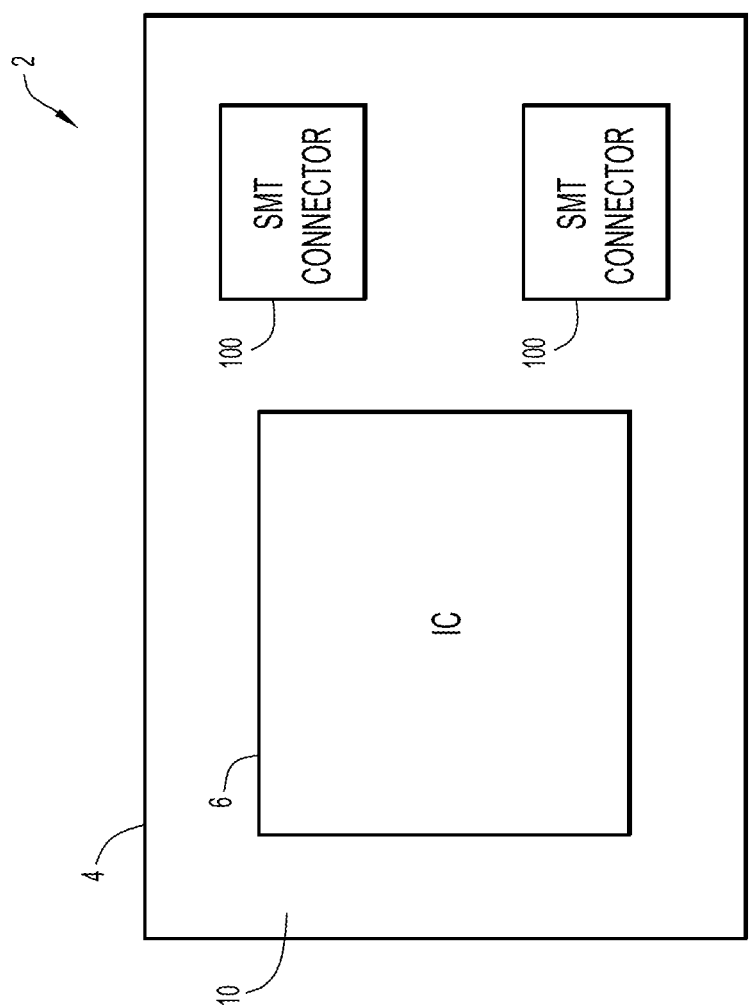

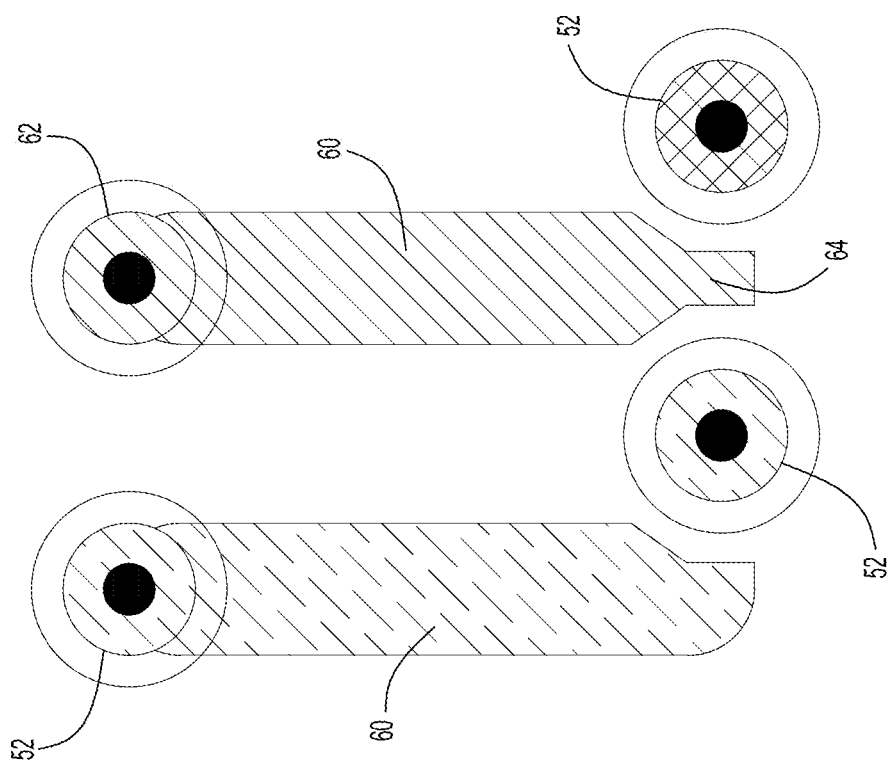

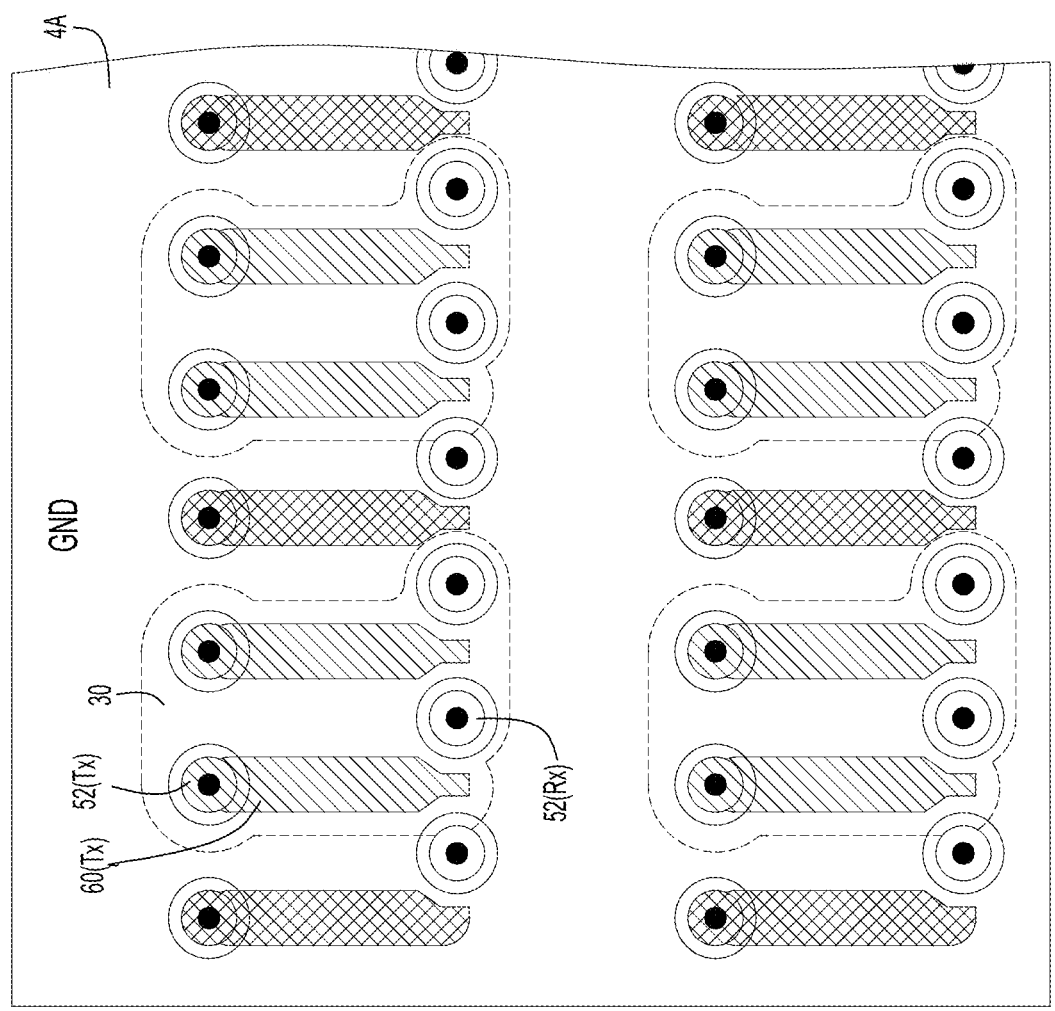

PRINTED CIRCUIT BOARD CONFIGURATION TO FACILITATE A SURFACE MOUNT DOUBLE DENSITY QSFP CONNECTOR FOOTPRINT IN A BELLY-TO-BELLY ALIGNMENT

CROSS REFERENCE TO RELATED APPLICATION

This application claims priority under 35 U.S.C. § 119(e) to U.S. Provisional Patent Application Ser. No. 62/896,619, entitled "Print Circuit Board Configuration To Facilitate a Surface Mount Double Density QSFP Connector Footprint in a Belly-To-Belly Alignment", filed Sep. 6, 2019, the disclosure of which is incorporated herein by reference in its entirety for all purposes.

TECHNICAL FIELD

The present disclosure relates to network interface module connections on printed circuit boards for data communications applications.

BACKGROUND

With increasing high-speed data communications, 400 Gigabit Ethernet (400 GbE) faces signaling challenges. Double-Density Quad Small Form Factor Pluggable (QSFP-DD) design has been adopted in current switch systems to increase capacity and efficiency, where electrical interfaces employ eight lanes that operate up to 53.125 Gbps Pulse-Amplitude Modulation 4-Level (PAM4). However, footprint layout designs for connectors are limited to single-height and stacked configurations that are currently available from connector vendors in the cage/connector system supporting QSFP-DD modules. It is desirable to address critical signal integrity issues and to design a high-density, low-crosstalk, ultra-compact footprint in order to achieve 400 GbE data communication and a future roadmap (beyond 400 GbE) for data communications.

BRIEF DESCRIPTION OF THE DRAWINGS

FIG. 1A is a schematic view of a printed circuit board (PCB) for an electronic device including QSFP-DD surface mount connectors arranged in a belly-to-belly surface mount configuration on the top and bottom surfaces of the PCB, where the PCB includes transmitter (Tx) and receiver (Rx) surface contacts/footprint pins for connecting with corresponding Tx and Rx connector pins of the surface mount connectors in accordance with an example embodiment.

FIG. 2C is a partial enlarged view of surface contacts/footprint pins in the grid depicted in FIG. 2A.

FIGS. 6A, 6B and 6C show example embodiments of design configurations for antipads associated with the vias for Tx and Rx footprint pins at different layers of a PCB.

DESCRIPTION OF EXAMPLE EMBODIMENTS

Overview

Figure 1B:
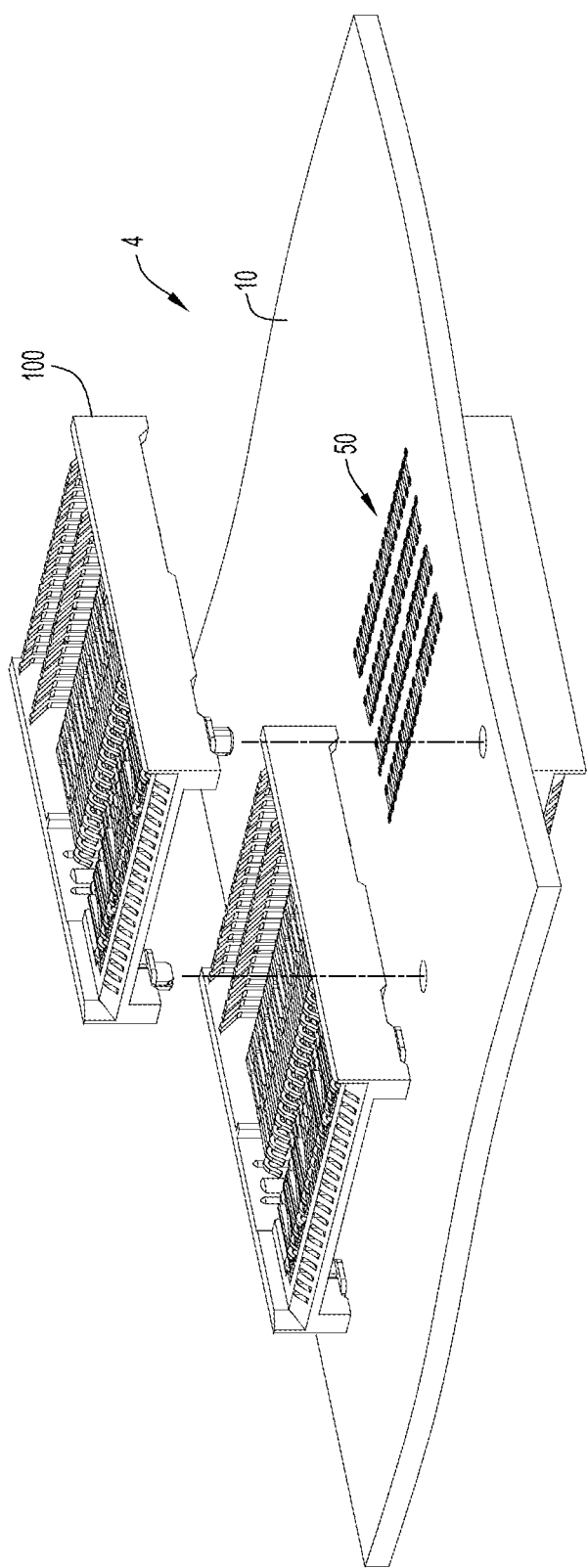
FIG. 1B is a partial view of the PCB of FIG. 1A depicting a surface mount connector separated from the PCB to show an underlying grid of (Tx) and receiver (Rx) surface contacts/footprint pins for connecting with corresponding Tx and Rx connector pins of the surface mount connector.

In an embodiment, a printed circuit board (PCB) comprises a grid comprising a plurality of footprint pins and a plurality of vias, the plurality of footprint pins and the plurality of vias being arranged along one or more linear rows, each footprint pin being disposed at a top surface or a bottom surface of the PCB, and each via extending through the PCB to the top and bottom surfaces. Each footprint pin is elongated and includes a connecting end and a free end that opposes the connecting end, each via includes a contact end that is located at one of the top surface and the bottom surface and is in electrical contact with the connecting end of one of the plurality of footprint pins, and each via further includes a non-contact end that is located at an other of the top surface and the bottom surface and is not in electrical contact with any of the plurality of footprint pins. Each linear row includes a first pair of the plurality of footprint pins and a second pair of the plurality of footprint pins, each of the first pair and the second pair including two footprint pins aligned adjacent to each other in the linear row. In addition, the free end of each footprint pin of the first pair extends in a first direction along the PCB, the free end of each footprint pin of the second pair extends in a second direction along the PCB, and the first direction opposes the second direction by 180°.

In another embodiment, an electronic device comprises a printed circuit board (PCB) comprising a first grid disposed at a top surface of the PCB and a second grid disposed at a bottom surface of the PCB. Each of the first and second grids comprises a plurality of footprint pins and a plurality of vias, the plurality of footprint pins and the plurality of vias being arranged along one or more linear rows at each of the first grid and the second grid, with each via extending through the PCB to the top surface and the bottom surface of the PCB such that each via is part of the first grid and the second grid. Each footprint pin is elongated and includes a connecting end and a free end that opposes the connecting end, each via includes a contact end that is located at one of the first grid and the second grid and is in electrical contact with the connecting end of one of the plurality of footprint pins, and each via further includes a non-contact end that is located at an other of the first grid and the second grid and is not in electrical contact with any of the plurality of footprint pins. Each linear row of the first grid and the second grid includes a first pair of the plurality of footprint pins and a second pair of the plurality of footprint pins, each of the first pair and the"

second pair including two footprint pins aligned adjacent to each other in the linear row. The free end of each footprint pin of the first pair extends in a first direction along the PCB, the free end of each footprint pin of the second pair extends in a second direction along the PCB, and the first direction opposes the second direction by 180°. The device further includes a first surface mount connector mounted to the top surface of the PCB and including surface mount pins that connect with footprint pins of the first grid, and a second surface mount connector mounted to the bottom surface of the PCB and including surface mount pins that connect with footprint pins of the second grid.

In a further embodiment, a method comprises providing an electronic device including a printed circuit board (PCB), where the PCB comprises a first grid disposed at a top surface of the PCB and a second grid disposed at a bottom surface of the PCB, each of the first and second grids comprising a plurality of footprint pins and a plurality of vias, the plurality of footprint pins and the plurality of vias being arranged along one or more linear rows at each of the first grid and the second grid, with each via extending through the PCB to the top surface and the bottom surface of the PCB such that each via is part of the first grid and the second grid. Each footprint pin is elongated and includes a connecting end and a free end that opposes the connecting end, each via includes a contact end that is located at one of the first grid and the second grid and is in electrical contact with the connecting end of one of the plurality of footprint pins, and each via further includes a non-contact end that is located at an other of the first grid and the second grid and is not in electrical contact with any of the plurality of footprint pins. Each linear row of the first grid and the second grid includes a first pair of the plurality of footprint pins and a second pair of the plurality of footprint pins, each of the first pair and the second pair including two footprint pins aligned adjacent to each other in the linear row, The free end of each footprint pin of the first pair extends in a first direction along the PCB, the free end of each footprint pin of the second pair extends in a second direction along the PCB, and the first direction opposes the second direction by 180°. A first surface mount connector is mounted to the top surface of the PCB such that surface mount pins of the first surface mount connector connect with footprint pins of the first grid, and a second surface mount connector is mounted to the bottom surface of the PCB such that surface mount pins connect with footprint pins of the second grid.

EXAMPLE EMBODIMENTS

The present disclosure relates to an electronic device comprising a printed circuit board (PCB) that includes a surface contacts configuration that facilitates surface mount connections with Ethernet and/or other data communications connectors along the top and bottom PCB surfaces and in a belly-to-belly configuration. In an embodiment, PCB includes a configuration of surface contacts and vias on its top and bottom surfaces aligned with each other to facilitate a connection of surface mount connectors arranged in a belly-to-belly configuration in relation to each other (i.e., where a bottom end of a connector on the top surface of the PCB faces a bottom end of a connector on the bottom surface of the PCB). Such a configuration provides a footprint layout design on the PCB that arranges a series of connectors in a close, densely packed manner to meet PAM4 Ethernet and other data communication signaling challenges.

Referring to FIGS. 1A-1B, 2A-2C and 3A-3B, an example embodiment is depicted of an electronic device 2 including a PCB 4 that facilitates connections along top and bottom surfaces 10, 20 of the PCB with surface mount connectors. The electronic device 2 can include one or more integrated circuits (shown generally as IC 6 on the PCB top surface 10 in FIG. 1A) as well as any other suitable electrical components disposed on the top or bottom surface and/or integrated within one or more layers of the PCB. The electronic device can comprise, e.g., any suitable type of networking device (e.g., gateway, bridge, hub, switch, router, etc.) and/or any other suitable type of computing device (or portion of a computing device) that facilitates communication of data signals to and from the device to other devices in a network. The PCB 4 can include one or more signal layers with electrical traces embedded at varying depths and layers within the PCB to route signals between electronic components integrated with the PCB. Some examples of electronic components associated with the PCB 4 are surface mount connectors 100. As described herein, the surface mount connectors 100 can be small form factor connectors, such as QSFP-Double Density (QSFP-DD) connectors, that facilitate high speed signal communications between the device 2 and other electronic devices over a network.

Surface mount connectors 100 are mounted directly to the top surface 10 and the bottom surface 20 of the PCB 4. Each surface mount connector 100 includes an array of surface mount technology (SMT) pins 110 (FIGS. 3A, 3B and 4) that, when mounted to a surface of the PCB as described herein, make electrical contact connections with an signal transfer array or contact grid 50 of corresponding electrical contact pads or footprint pins electrically connected with vias and disposed along the top and bottom surfaces of the PCB. The SMT pins 110 of each surface mount connector 100 can be formed of a metal or other suitably conductive material (e.g., copper) and extend from a lower surface of the connector have a general "L" shape that bends to form a generally flat contact surface area for a corresponding footprint pin of a corresponding grid 50 of footprint pins on the PCB top surface 10 or bottom surface 20. Similarly, the surface contacts or footprint pins of the PCB 4 are also formed of a metal or other suitably conductive material (e.g., copper) and suitably dimensioned to engage with the flat contact surface area of the SMT pins 110. As described herein, the footprint pins provided along the grid 50 can be provided in pairs (e.g., two footprint pins provided adjacent to each other along a row of footprint pins and vias in a grid), with two or more different types of pairs (e.g., first pairs, second pairs, etc.) for facilitating different types of signal transmission (e.g., transmit or Tx signals, receive or Rx signals, etc.).

The PCB 4 can include any suitable number of contact grids 50 of footprint pins 60 that are suitably dimensioned and oriented to facilitate connections with surface mount connectors 100 for facilitating transmission and receipt of signals between the PCB and the connectors, where the vias of the grid 50 extend through the PCB 4 so as to define mounting locations for two connectors 100 at about the same or similar surface location and in a belly-to-belly configuration along the PCB top surface 10 and PCB bottom surface 20 (as shown in FIG. 1A). The connectors 100 can further connect and make electrical contact via the SMT pins 110 with corresponding footprint pins of a contact grid 50 in any suitable manner, such as via a solder connection (e.g., each SMT pin of a connector is soldered to a corresponding footprint pin of the PCB contact grid), a frictional engagement using a press fit and/or spring connection to affix the connector against the PCB top or bottom surface, etc.

Referring to FIGS. 2A-2C, 3A, 3B and 4, the grid 50 includes a plurality of linear rows of surface contacts or footprint pins 60 and vias 52 that correspond in orientation, alignment and number with corresponding linear rows of SMT pins 110 for a connector 100. To facilitate high speed signal transmissions, each surface of the PCB includes an array or grid 50 of vias 52, including ground vias, transmitter (Tx) vias and receiver (Rx) vias. The grid 50 also includes contact pads or footprint pins 60 that include ground footprint pins, Tx footprint pins and Rx footprint pins that are aligned and are in electrical contact with the corresponding ground, Tx and Rx vias. As described herein, each via 52 extends through the PCB 4 (i.e., extending to each of the PCB top surface 10 and PCB bottom surface 20) but includes only a single footprint pin 60 connected with the via on either the top or bottom surface of the PCB. The Tx footprint pins and Tx vias facilitate transmission of signals from the electronic device (e.g., via traces that electrically connect with the vias) to the module via its connector, while the Rx footprint pins and Rx vias facilitate receiving or receipt of signals from the module via its connector to the electronic component.

In an example embodiment, the grid 50 of footprint pins 60 and vias 52 includes four rows of footprint pins with eight pairs of transmitter (Tx) footprint pins and eight pairs of receiver (Rx) footprint pins. A pair of Tx or Rx footprint pins comprises two Tx or Rx footprint pins aligned adjacent or consecutively next to each other along a row of the grid 50. Each row of footprint pins includes two pairs of Tx footprint pins and two pairs of Rx footprint pins which engage in electrical contact with Tx and Rx SMT pins 110 of a connector 100 when the connector is secured to the PCB surface. Each row of footprint pins 60 further includes ground footprint pins and low speed footprint pins, where ground footprint pins are located adjacent or consecutively next to each pair of Tx and Rx footprint pins within a row of the grid 50. Further, the pairs of Tx and Rx footprint pins in each row of the grid 50 are located near the ends of the row while the low speed footprint pins are located at the middle of each row.

As noted herein, the surface mount connectors that connect with the grids 50 of footprint pins 60 can be small form pluggable surface mount connectors, such as QSPF-DD surface mount connectors, that are capable of performing high speed transfer of signals to and from the electronic device 2. A non-limiting example embodiment of a suitable QSFP-DD surface mount connector that is configured with SMT pins arranged in rows to connect with the grid 50 of footprint pins 60 along a top or bottom surface of the PCB 4 is an optical module connector designed by Molex, LLC (Part Number: 202718-0100). The surface mount connector can have multiple rows of signal contacts/SMT pins and ground contacts/SMT pins that extend from the mated interface of the optical module to engage with the footprint pins of the printed circuit board.

Each footprint pin 60 has an elongated configuration having a generally uniform or constant width, where the footprint pin 60 makes contact or electrical connects at one end 62 (a connecting end) with a corresponding via 52 and includes an opposing terminal or free end 64 that is tapered (i.e., smaller in width dimension at the free end in relation to the generally constant width of the footprint pin along the remaining portions of its length).

The tapered free end 64 of each footprint pin 60 enables close spacing of footprint pins next to each other within rows of the grid 50 while avoiding contact with neighboring vias on either side of the footprint pins (i.e., as shown in the figures, the tapered free end of at least some of the footprint pins is disposed between two vias within each linear row of the grid). All of the footprint pins 60 in each row of a grid 50 are aligned generally parallel with each other, where a via 52 is disposed between the tapered free ends 64 of every two consecutively aligned footprint pins 60. The view of the grid 50 depicted in FIG. 2A corresponds with a top view in plan of how the grid is arranged at the top surface 10 of the PCB 4 (e.g., the grid 50 depicted in FIG. 1B), while the view of the grid 50 depicted in FIG. 2B corresponds with the arrangement of the grid at the PCB bottom surface 20 when viewed from the top surface 10 (i.e., looking downward from the PCB top surface 10 toward the PCB bottom surface 20). Thus, the grid 50 at the top surface 10 that overlies and is generally aligned with the grid 50 at the bottom surface 20 is configured such that vias extending through the PCB 4 are located within both of the aligned grids, where each linear row of footprint pins and vias for the top surface grid corresponds or is aligned with a corresponding linear row of footprint pins and vias for the bottom surface grid that shares the same vias as the top surface grid (i.e., the same vias are located in both the top and bottom surface grids).

Figure 4:
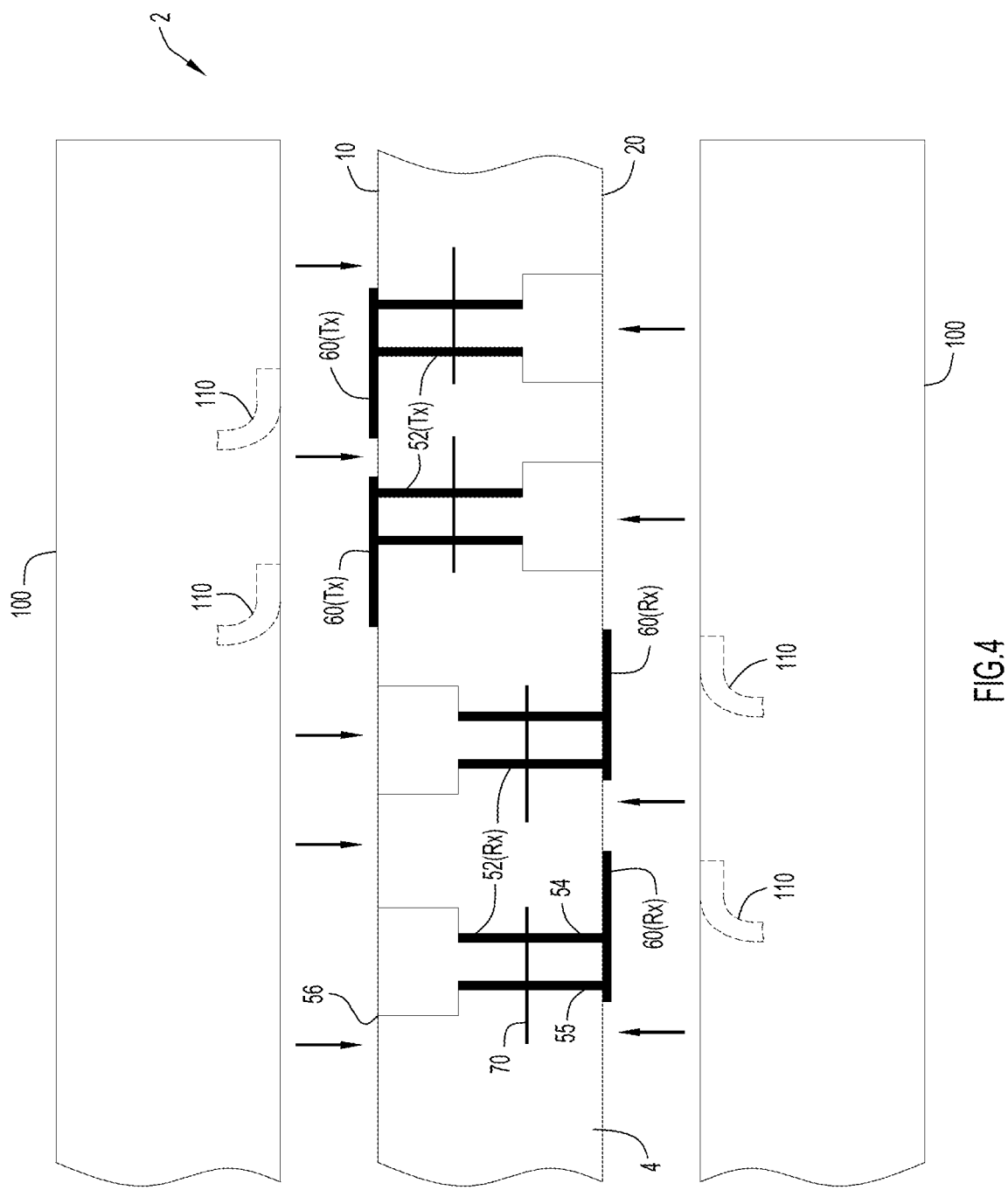
FIG. 4 is a schematic view showing a partial cross-section of the PCB of FIGS. 1A and 1B (taken along line A-A of the vias and footprint pin arrangement as shown in FIGS. 2A and 2B) and partial views of two connectors that connect along the top and bottom surfaces of the PCB in the manner as shown in FIG. 1B.

Referring to FIG. 4, each via 52 extends through the PCB 4 to the top surface 10 and the bottom surface 20. Each via 52 connects at a contact end 54 with only a single footprint pin 60 (via the connecting end or end 62 of the footprint pin 60) at either the PCB top or bottom surface, while the other end or non-contact end 56 of the via 52 is not connected to any footprint pin. The contact end 54 of each via 52 includes a metal or other electrically conductive contact member 55 provided along the surface of the via that extends a suitable depth within the PCB 4 to a selected layer so as to connect with an electrically conductive trace 70. Traces 70 of different vias 52 can be located at varying depths and/or varying layers within the PCB 4, where the traces facilitate transfer of signals (e.g., Tx and Rx signals) between components of the PCB 4 and the surface mount connectors 100 during operation of the device 2. The non-contact end 56 of the via 52 can be backdrilled to a suitable/selected depth (e.g., such that no electrical contacts within the via extend to the non-contact end 56).

Figure 2A:
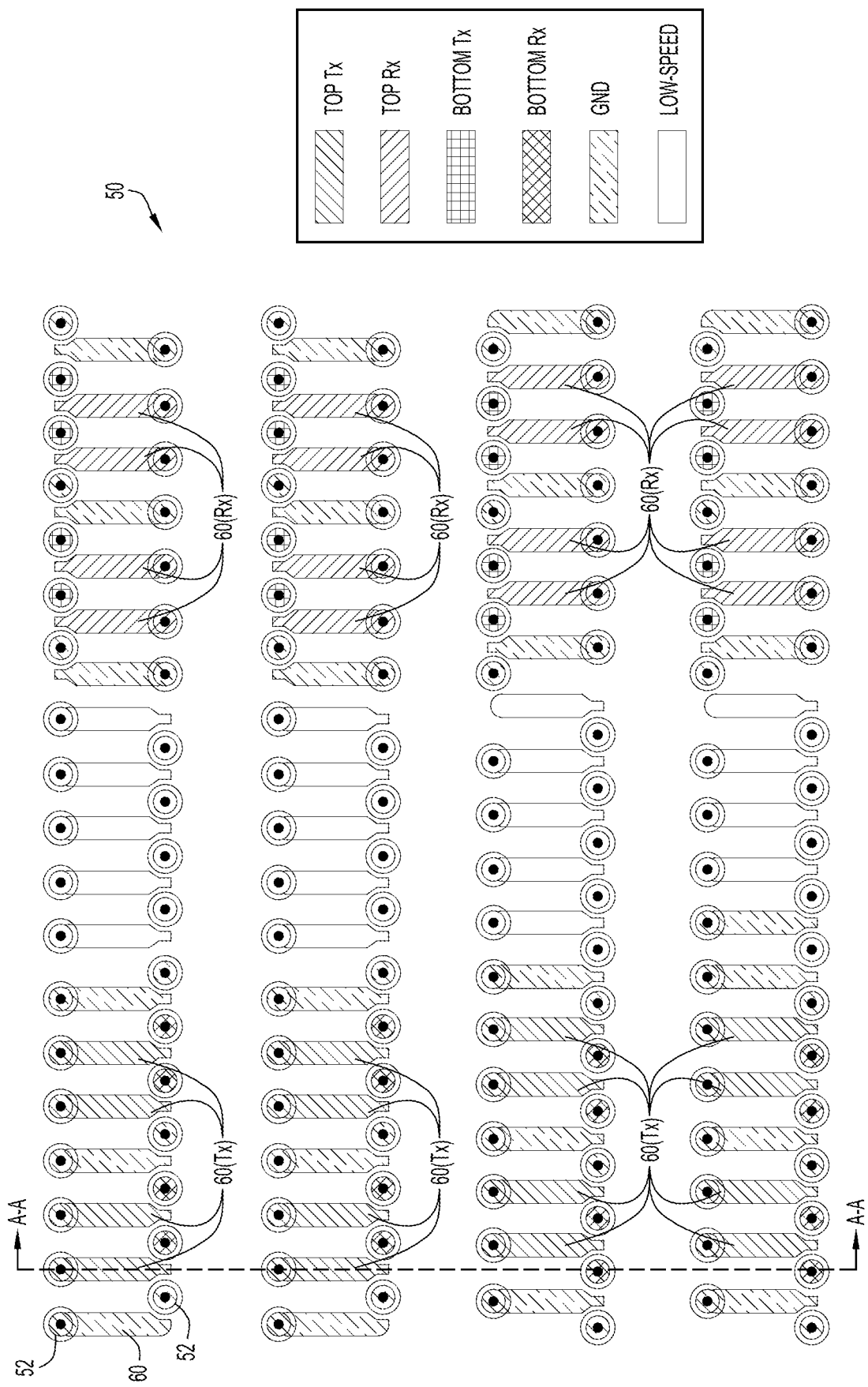
FIGS. 2A and 2B are views of a via and contact arrangement or grid at the top and bottom surfaces, respectively, of the PCB of FIGS. 1A and 1B, in which Tx and Rx surface contacts/footprint pins and vias are shown that are configured to align and connect with corresponding QSFP-DD surface mount connectors.
Figure 2B:
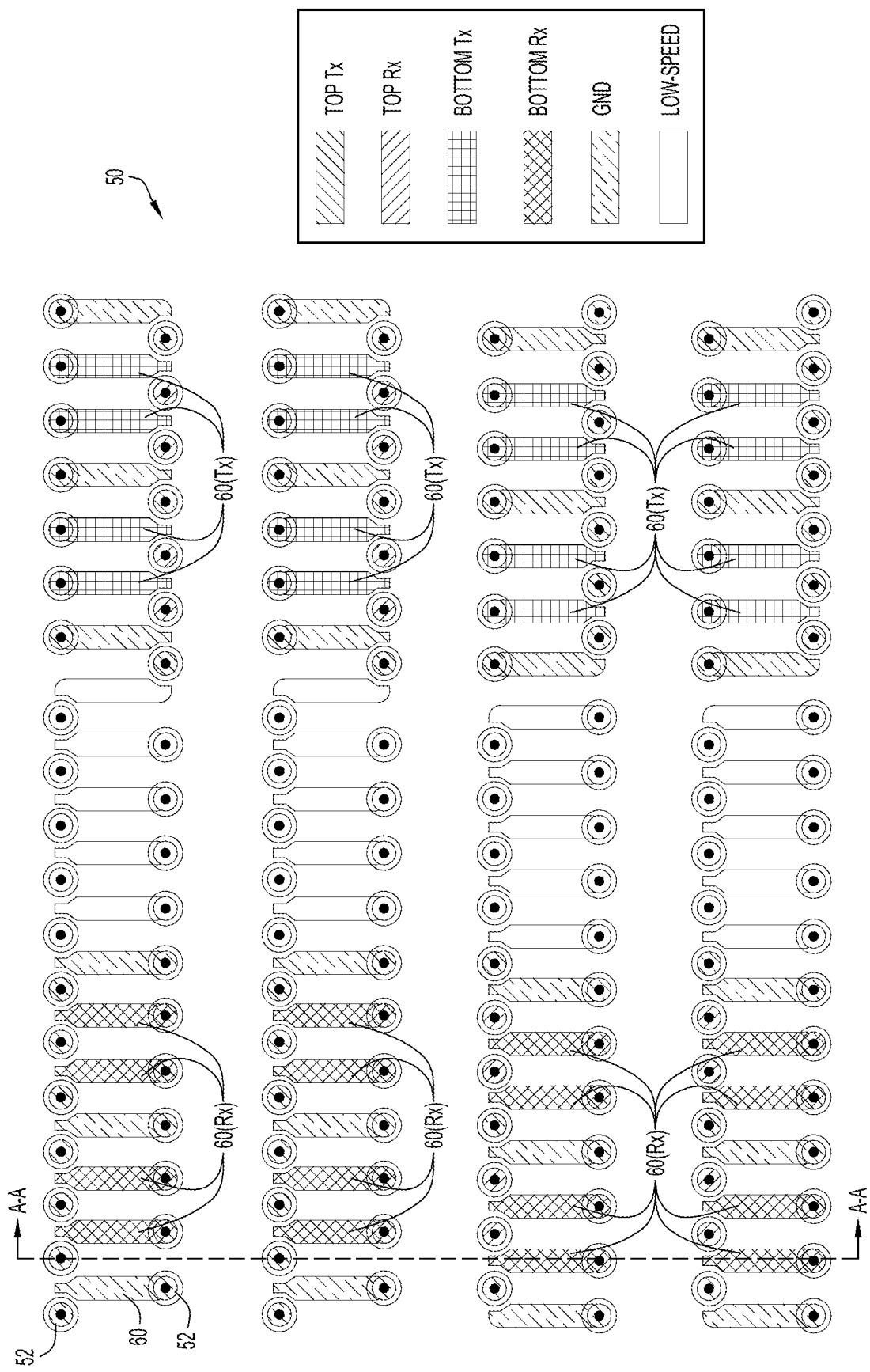

As depicted in FIGS. 2A and 2B, a grid 50 includes four linear rows of footprint pins 60, with each row including two pairs of (or a total of four) Tx footprint pins and two pairs of (or a total of four) Rx footprint pins. The Tx footprint pins 60(Tx) in each row are oriented so as to extend in the same direction from their ends 62 adjacent and in electrical contact with their corresponding Tx vias 52(Tx) toward their free ends 64. Similarly, the Rx footprint pins 60(Rx) in each row are oriented so as to extend in the same direction from their ends 62 adjacent and in electrical contact with their corresponding Rx vias 52(Rx) toward their free ends 64. Each Tx footprint pin 60(Tx) within each row is further positioned in a 180° opposite orientation in relation to each Rx footprint pin 60(Rx) within the same row. Thus, the tapered free ends 64 of the Tx footprint pins 60(Tx) are situated on the PCB top or bottom surface along a linear path that corresponds with the ends 62 of the Rx footprint pins 60(Rx), while the tapered free ends 64 of the Rx footprint pins 60(Rx) are situated on the PCB top or bottom surface along a linear path that corresponds with the ends 62 of the Tx footprint pins 60(Tx). To state in a different manner, a linear row of the grid 50 includes Tx pairs of Tx footprint pins 60(Tx) and Rx pairs of Rx footprint pins 60(Rx) (where each pair of footprint pins includes two footprint pins aligned adjacent to each other in the row), and the free end 64 of each Tx footprint pin 60(Tx) in the Tx pair extends in a first direction along the PCB, the free end 64 of each Rx footprint pin 60(Rx) in the Rx pair extends in a second direction along the PCB, and the first direction opposes the second direction by 180°.

Figure 3B:
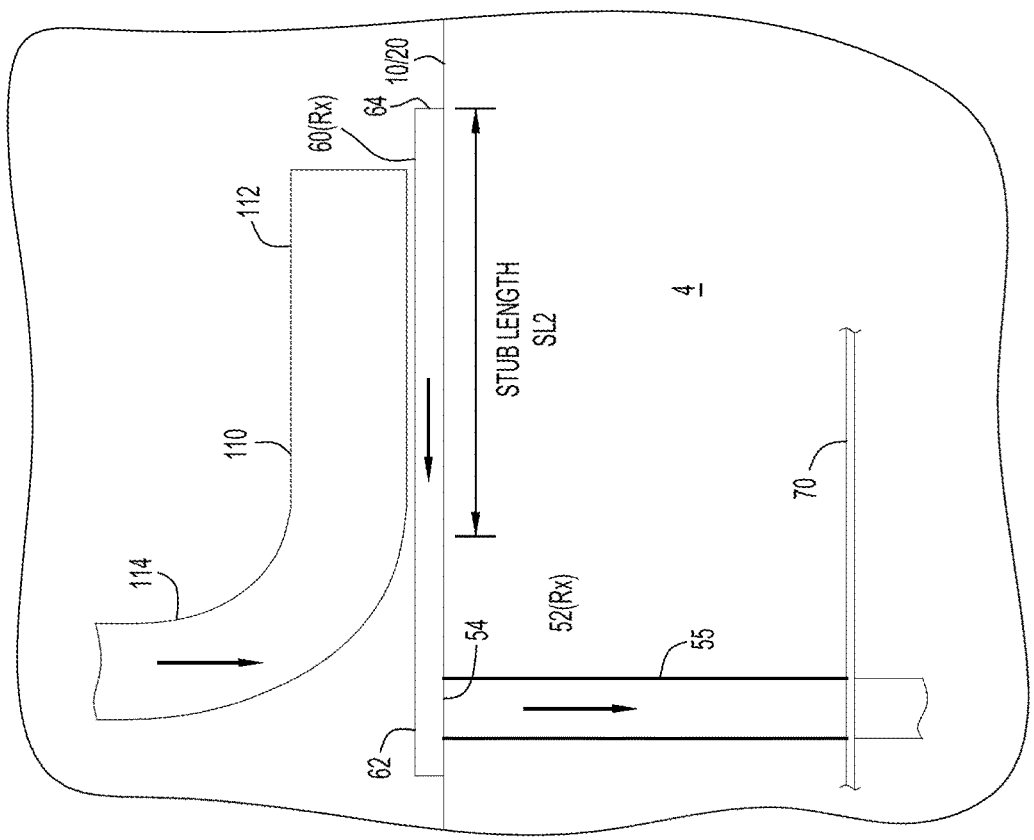
FIGS. 3A and 3B are partial cross-sectional views of the PCB for the device of FIGS. 1A and 1B showing an example embodiment of Tx and Rx surface mount technology (SMT) pins of the QSFP-DD surface mount connectors and how such SMT pins connect with corresponding Tx and Rx footprint pins along the PCB top and bottom surfaces.
Figure 3A:
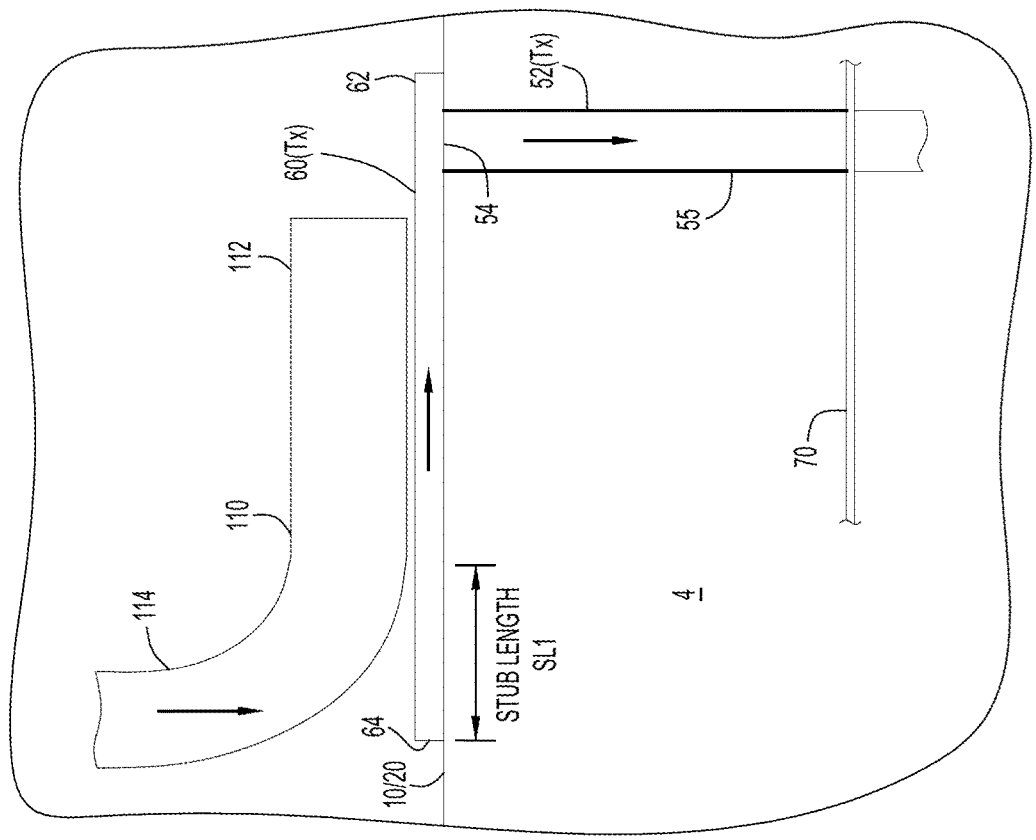

The orientation of Tx and Rx footprint pins along the rows of the grids 50 located on the PCB top surface 10 and PCB bottom surface 20 facilitates connection of the surface mount connectors 100 in a belly-to-belly configuration on either side of the PCB 4 while maintaining an alignment of SMT pins 110 of the connectors with the Tx footprint pins 60(Tx) and Rx footprint pins 60(Rx) as depicted in FIGS. 3A, 3B and 4. In particular, each SMT pin 110 of a surface mount connector 100 has a general L-shape that includes a free, generally flat terminal end portion or tail member 112 of the pin that makes contact with the footprint pin 60 for the via 52 and also an upwardly extending portion or head member 114 that connect the SMT pin 110 within the connector. The SMT pins 110 for each of the surface mount connectors 100 are oriented in the same manner with their tail members 112 extending in the same direction outward from their head members 114. The connectors are further oriented such that each SMT pin 110 that engages/electrically connects with a Tx footprint pin 60(Tx) has its tail member 112 extending toward the Tx via 52(Tx), while each SMT pin 110 that engages/electrically connects with a Rx footprint pin 60(Rx) has its tail member 112 extending away from the Rx via 52(Rx). As further depicted in FIGS. 1A and 4, each connector 100 connected with the PCB 4 along top surface 10 and bottom surface 20 in the belly-to-belly configuration is aligned in the same direction (i.e., the tail members 112 for both connectors 100 extend in the same direction). In other words, the connectors 100 in the belly-to-belly configuration are oriented in a 180° rotational position in relation to each other but with their SMT pins 110 extending in the same direction.

Referring again to FIGS. 2A and 2B, due to the configuration of the footprint pins and vias for each grid 50, the rows of footprint pins 60 for the grid 50 at the top surface 10 of the PCB 4 are shifted or offset in the linear direction of the rows by a pin width in relation to the rows of footprint pins 60 for the grid 50 at the bottom surface 10 of the PCB which shares vias with the top surface grid. In other words, each linear row of footprint pins and vias of the top surface grid is offset in a linear direction of the linear row by a footprint pin width in relation to the corresponding linear row of footprint pins and vias of the bottom surface grid that shares vias with the top surface grid. This results in the connectors 100 being shifted or offset in relation to each other by the same pin width distance in the belly-to-belly configuration (such that the SMT pins 110 of the connectors 100 align to engage/connect with corresponding footprint pins 60).

Return loss minimization in the footprint pins 60 for the grid 50 enables high speed data transmissions (e.g., 400 GbE data transmission). The footprint pins 60 can have any dimensions configured to suitably mate with the tail members 112 of SMT pins 110. The contact area between footprint pin 60 and tail member 112 of an SMT pin 110 can have a generally rectangular shape. In an example embodiment, each footprint pin 60 can have a width of about 0.35 mm (until tapering at the free end 64) and a length of about 1.6 mm.

The current flow from the SMT pin 110 to the corresponding via 52 and the contact area between the tail member 112 and the footprint pin 60 acts as a stub, where the stub length for the Tx and Rx configurations between surface mount connector and PCB is shown in FIGS. 3A and 3B. This configuration for connection between the tail member 112 of a SMT pin 110 and a Tx footprint pin 60(Tx) is desirable, because the current flow path through the head member 114 of the SMT pin 110 and through the contact area between tail member 112 and footprint pin 60 is minimized for this configuration (as shown in the comparison of the orientations shown in FIGS. 3A and 3B, where the stub length SL1 associated with the Tx current flow path is less than the stub length SU for the Rx current flow path). This orientation is particularly beneficial to reduce stub length and signal loss for Tx lanes, since Tx lanes are typically more sensitive to return losses during signal transmission. In example embodiments using QSFP-DD connectors and grids 50 dimensioned to connect with the SMT pins of such connectors, the stub length for the Tx lanes (connections of SMT pins with Tx footprint pins and Tx vias) can be minimized to about 20 mil, while stub length for the Rx lanes (connections of SMT pins with Rx footprint pins and Rx vias) are about 40 mil or about twice the length.

The orientation of Tx and Rx lanes in the grids along the PCB surfaces allows for optimal Tx performance during high speed data signal communications between the device 2 and other devices. In high speed signal transfer operations, each Tx and Rx lane can operate at speeds as high as 53 Gbps. At such signal speeds, even small impedance fluctuations can cause undesired signal losses and other issues. The via and footprint pin configuration for the grids 50 as described herein effectively control impedance and minimize reflection. Further, since Tx performance is typically the bottleneck for high speed data communications (e.g., for 400G optical compliance testing), the minimization of stub length for the Tx signal transfer lanes provides a reduction in signal reflection and thus better quality of Tx signals during high speed data communications.

In addition to providing minimized stub length for Tx signal reflection reduction, the PCB grids with specified footprint of vias and orientation of Tx/Rx footprint pins provides other advantages for enhancing high speed data signal communications between devices.

Figure 5A:
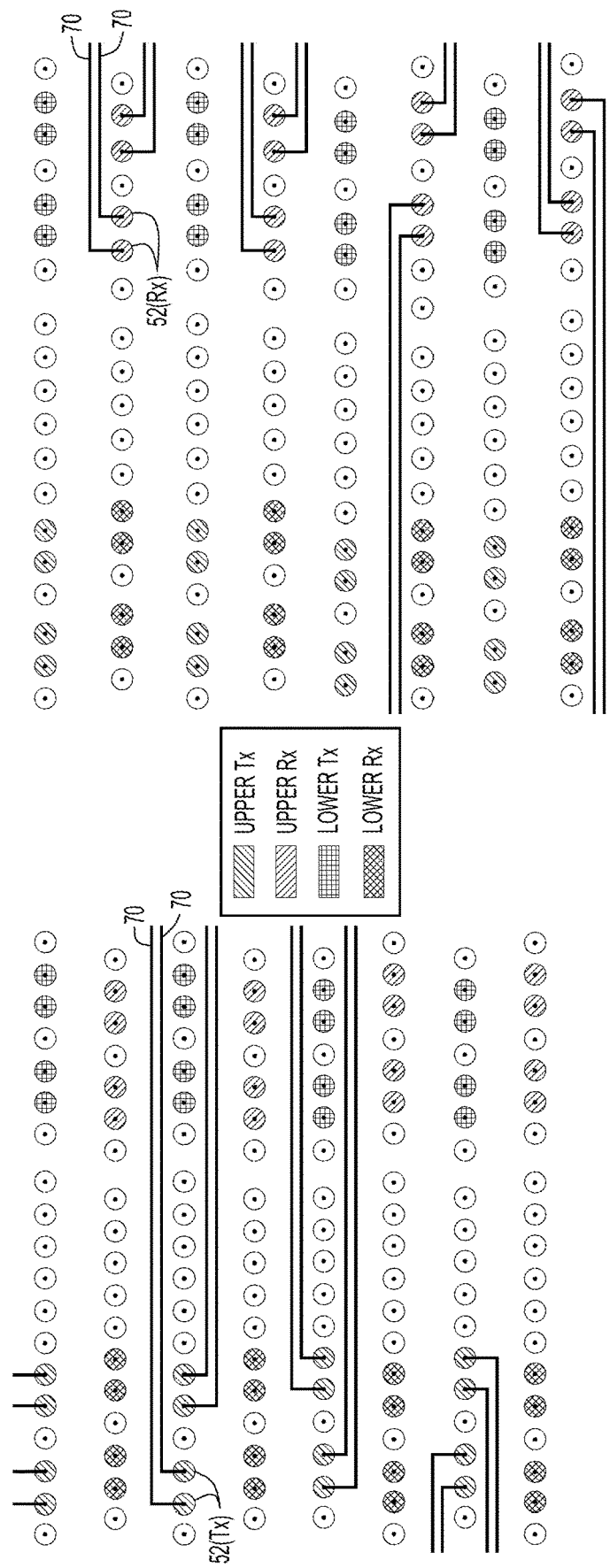
FIGS. 5A and 5B are schematic views associated with PCB top and bottom surfaces, respectively, showing the routing of the electrical/escape trace connections (e.g., disposed within one or more layers of the PCB) for the Tx and Rx footprint pins along the PCB surfaces in accordance with an example embodiment.
Figure 5B:
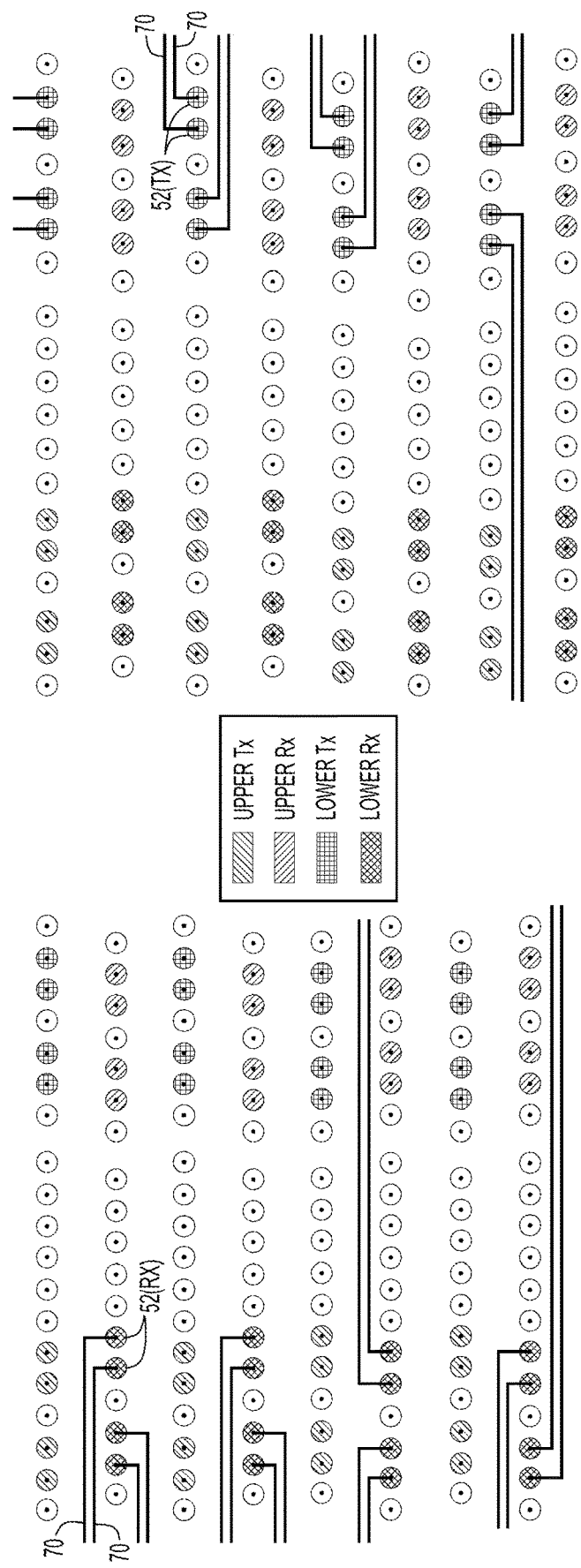

For example, the PCB grid configuration facilitates improved routability of data signals by allowing for belly-to-belly connections of surface mount connectors to the PCB (as shown in FIG. 1A). The pitch size (center-to-center distance between two adjacent footprint pins 60 of the PCB 4) of a standard or conventional QSFP-DD connector is 31.5mil. The PCB via and footprint pin grid 50 as described herein enables free routability with no limitation for the breakout design of the Tx and Rx pairs, and each differential pair could utilize the above and below routing channels. Referring to FIGS. 5A and 5B, routing examples for the escape/routing of traces 70 from pairs of Tx vias 52(Tx) and Rx vias 52(Rx) along the top and bottom PCB surfaces are depicted (top surface trace routing shown in FIG. 5A, bottom surface trace routing shown in FIG. 5B). The trace routing can be configured within a single layer of the PCB due to the optimized Tx and Rx pin and via arrangement along both surface of the PCB, such that minimum routing PCB layers are needed for this footprint design. Alternatively, the traces can also be routed in two or more layers depending upon a particular application.

The PCB footprint pin and via grid arrangement can be further enhanced by providing an antipad configuration that optimizes impedance control during signal transfer operations. An antipad comprises a clearance, space, void or cut-out hole in a layer surrounding or located around a via.

Figure 6B:
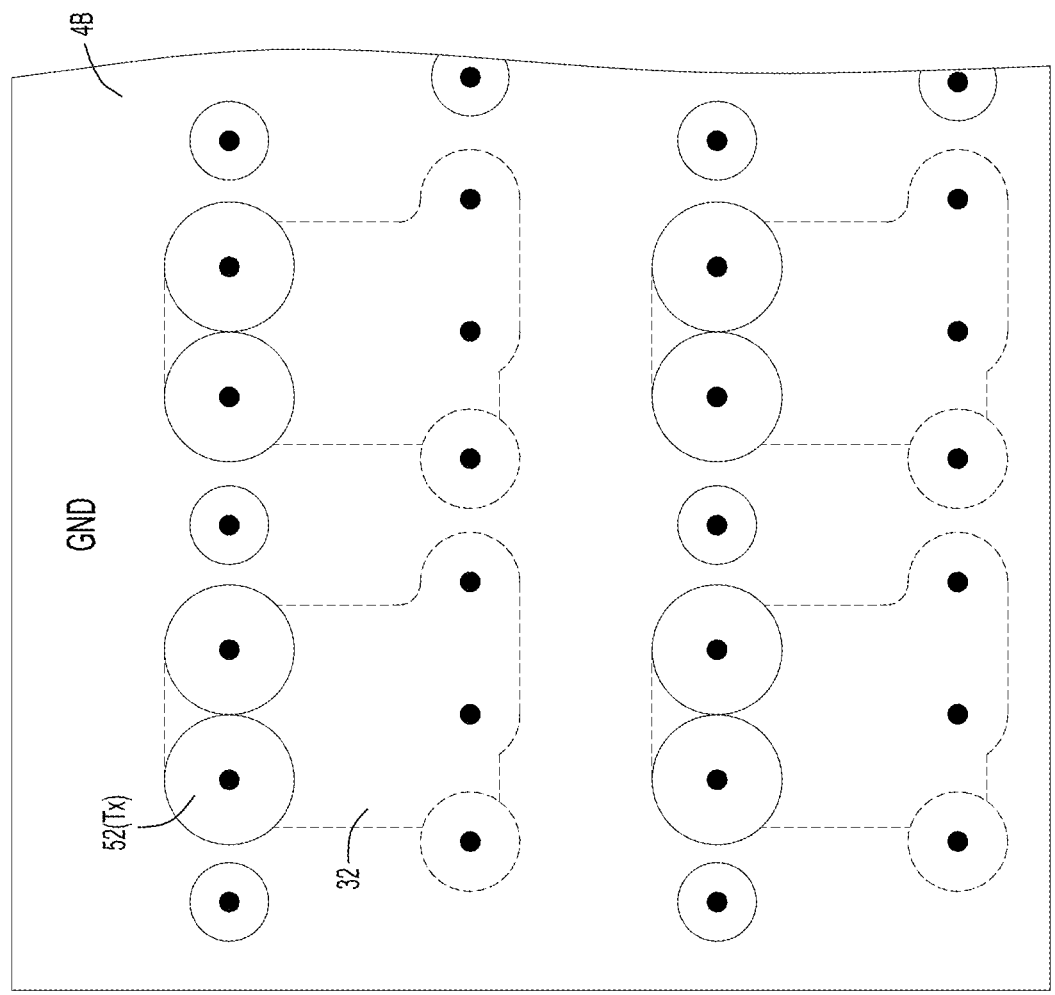
Figure 6C:
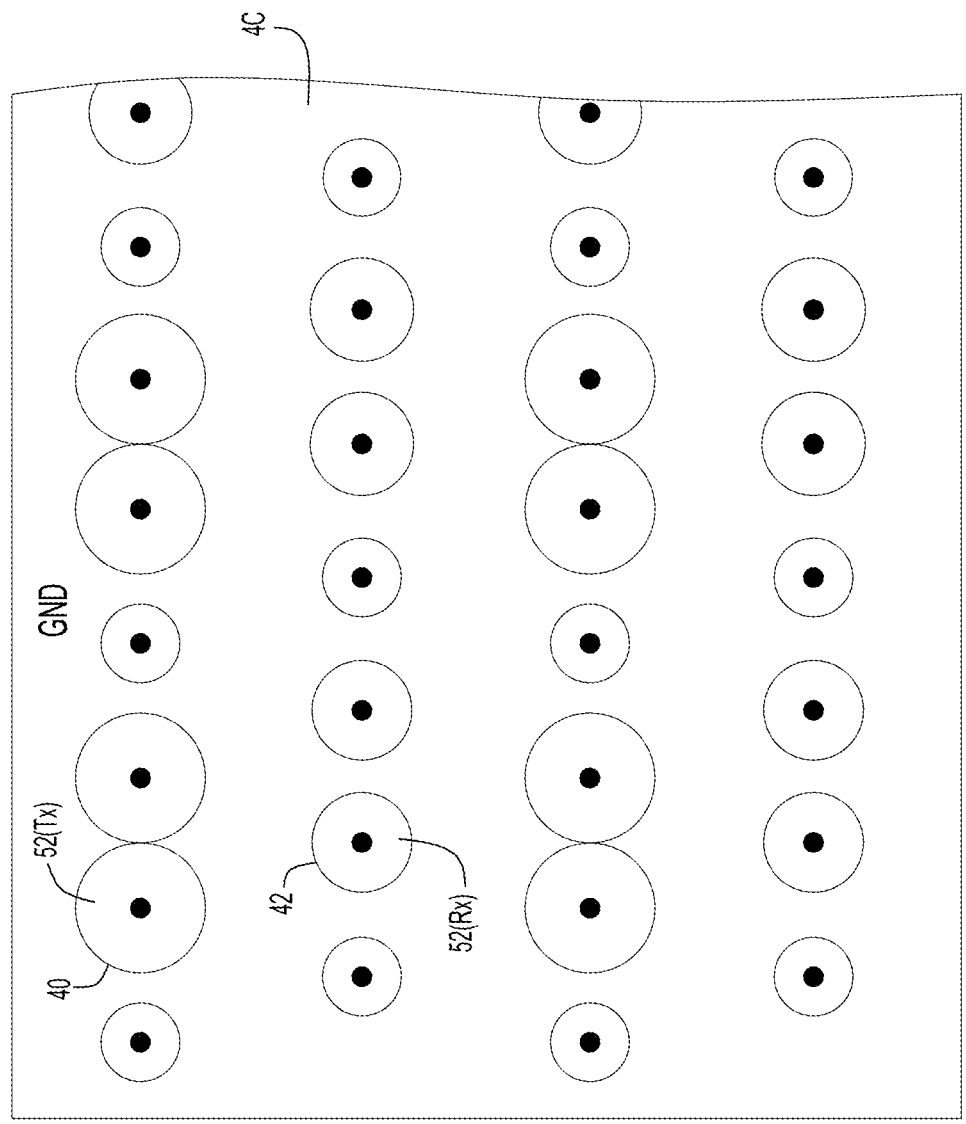

Referring to FIGS. 6A-6C, different PCB layers proximate a top or bottom surface are depicted showing antipad configurations around vias that differ in size or dimension depending upon whether a corresponding via is electrically connected with a footprint pin. A cutout design is shown in each of the outer, top layer 4A in FIG. 6A and an underlying layer 4B (e.g., G02 layer) in FIG. 6B. To control the impedance, a shape of void in the ground (GND) layer is designed to minimize the capacitance of the pin. A cutout region 30 is provided in the layer 4A of FIG. 6A, with a corresponding cutout region 32 provided in the underlying layer 4B of FIG. 6B. Referring to FIG. 6C, a further PCB layer 4C is shown demonstrating that two antipad sizes are utilized for all PCB layers through top to bottom surfaces of the PCB. The PCB layer 4C depicted in FIG. 6C can be a signal layer in which Tx and/or Rx traces are routed within the PCB 4. For the PCB layers where there are vias going through to connect to a trace (e.g., via 52(Tx) as shown in FIGS. 6A-6C), the antipad 40 has a first cross-sectional dimension (e.g., 32 mil in diameter) suitable to achieve optimized impedance control for signal transmission utilizing the via. For the layers in which vias are backdrilled (i.e., layers proximate via non-contact ends 56), the antipad 42 has a second cross-sectional dimension (e.g., 26 mil in diameter) that is smaller in dimension than the first dimension. This smaller second dimension for such antipads 42 at these layers facilitates sufficient routing channel widths within the signal layers to which such antipads are associated. Thus, unlike conventional designs which utilize a single size for the antipads, the antipad configurations described herein for various layers of the PCB 4 can be of varying sizes (e.g., with a smaller antipad dimensions in layers for the via portion which is backdrilled and larger antipad dimensions for the via portion in layers which is not backdrilled) so as to provide easy routing of contact areas for engaging the SMT pins of the connectors as well as routing of traces within the PCB.

A further advantage of the via footprint configuration for the grids 50 at the PCB top and bottom surfaces as described herein is the minimization of signal crosstalk between footprint pins at the PCB surface and traces disposed within the PCB. The footprint pins 60 can be evenly spaced (as shown, e.g., in FIGS. 2A and 2B) to form routing channels, with the signal contacts and ground contacts being arranged in a pattern so as to reduce crosstalk. Referring, e.g., to FIGS. 5A and 5B, routing channels along which Tx and Rx traces are routed are defined between two adjacent rows of vias. A routing channel width can be suitably dimensioned to minimize via to via crosstalk (e.g., a routing channel width can be about 32 mil). For via to via crosstalk, the routing of traces can be configured (as shown in FIGS. 5A and 5B) such that only one aggressor Tx or Rx pair (the adjacent pair located at the same row) might introduce crosstalk interference. As shown by the trace paths depicted in FIGS. 5A and 5B, the traces for a first pair of Tx or Rx traces is routed along a routing channel along a first side of a row of vias that is opposite a second side of the row from which a second pair of Tx or Rx traces from the same row is routed. The routing channel dimensions and configuration of routing of pairs of Tx and Rx traces such that only a single Tx or Rx trace pair is routed in each routing channel can effectively minimize trace layer-to-layer crosstalk and via-to-trace crosstalk.

Thus, the PCB via design with Tx and Rx contacts/pads arranged in an array or grid on each of the top and bottom PCB surfaces facilitates a belly-to-belly connection configuration using, e.g., SMT QSFP-DD connectors. The PCB footprint pin design, configuration, combined with via design, configuration and arrangement to form a grid, along with antipad designs for vias and Tx and Rx routing of traces within one or more layers of the PCB also enhances effective high speed signal transmission, e.g., for enhancing high speed data communications (e.g., 400 GbE and beyond), and provides a high-density, low-crosstalk, ultra-compact footprint design for connection with surface mount connectors on the PCB of the device.

Thus, an example embodiment of a printed circuit board (PCB) comprises a grid comprising a plurality of footprint pins and a plurality of vias, the plurality of footprint pins and plurality of vias being arranged along one or more linear rows. Each footprint pin is disposed at a top surface or a bottom surface of the PCB, and each via extends through the PCB to the top surface and the bottom surface of the PCB. Each footprint pin is elongated and includes a connecting end and a free end that opposes the connecting end, each via includes a contact end that is located at one of the top surface and the bottom surface and is in electrical contact with the connecting end of one of the plurality of footprint pins, and each via further includes a non-contact end that is located at an other of the top surface and the bottom surface and is not in electrical contact with any of the plurality of footprint pins. In addition, each linear row includes a first pair of the plurality of footprint pins and a second pair of the plurality of footprint pins, each of the first pair and the second pair including two footprint pins aligned adjacent to each other in the linear row; The free end of each footprint pin of the first pair extends in a first direction along the PCB, the free end of each footprint pin of the second pair extends in a second direction along the PCB, and the first direction opposes the second direction by 180°.

The non-contact end of each via for the PCB can be backdrilled to a selected depth within the PCB. In addition, the free end of each footprint pin can be tapered such that a first width dimension of the free end is smaller than a second width dimension along other lengthwise portions of the footprint pin. The free end for at least some of the footprint pins can be disposed between two vias arranged along the linear row.

The grid for the PCB can comprise four linear rows of footprint pins and vias. For example, each linear row can include two pairs of transmitter (Tx) footprint pins that facilitate transmission of signals from the PCB to a connector that connects with the transmitter (Tx) footprint pins, and each linear row can further include two pairs of receiver (Rx) footprint pins that facilitate receipt of signals from the connector that connects with the receiver (Rx) footprint pins, where the free ends of the transmitter (Tx) footprint pins in each row extend in the first direction and the free ends of the receiver (Rx) footprint pins in each row extend in the second direction.

The PCB can include a first grid disposed at the top surface of the PCB and a second grid disposed at the bottom surface of the PCB, where the vias (which extend through the PCB) are located within the first and second grids, each of the first grid and the second grid includes a plurality of linear rows of footprint pins and vias, and each linear row of the first grid is aligned with a corresponding linear row of the second grid. Further, each linear row of footprint pins of the first grid can be offset in a linear direction of the linear row by a footprint pin width in relation to the corresponding linear row of footprint pins of the second grid.

The PCB can include a plurality of layers with antipads located around vias within each layer, where a cross-sectional dimension of an antipad varies at different layers for at least one via. The antipad located at a contact end of the at least one via can be greater in cross-sectional dimension in relation to the antipad located at the non-contact end of the at least one via.

In another example embodiment, an electronic device comprises a printed circuit board (PCB) and first and second surface mount connectors. The PCB can comprise a first grid disposed at a top surface of the PCB and a second grid disposed at a bottom surface of the PCB, each of the first and second grids comprising a plurality of electrically conductive footprint pins and a plurality of vias, the plurality of footprint pins and the plurality of vias being arranged along one or more linear rows at each of the first grid and the second grid. Each via can extend through the PCB to the top surface and the bottom surface of the PCB such that each via is part of the first grid and the second grid. Each footprint pin can be elongated and include a connecting end and a free end that opposes the connecting end, each via can include a contact end that is located at one of the first grid and the second grid and is in electrical contact with the connecting end of one of the plurality of footprint pins, and each via can further include a non-contact end that is located at an other of the first grid and the second grid and is not in electrical contact with any of the plurality of footprint pins. Each linear row of the first grid and the second grid can include a first pair of the plurality of footprint pins and a second pair of the plurality of footprint pins, where each of the first pair and the second pair includes two footprint pins aligned adjacent to each other in the linear row. The free end of each footprint pin of the first pair can extend in a first direction along the PCB, the free end of each footprint pin of the second pair can extend in a second direction along the PCB, such that the first direction opposes the second direction by 180°. The first surface mount connector can be mounted to the top surface of the PCB and include surface mount pins that connect with footprint pins of the first grid, and the second surface mount connector can be mounted to the bottom surface of the PCB and include surface mount pins that connect with footprint pins of the second grid.

The non-contact end of each via for the first grid and the second grid of the electronic device can be backdrilled to a selected depth within the PCB. In addition, the free end of each footprint pin for the first grid and the second grid can be tapered such that a first width dimension of the free end is smaller than a second width dimension along other lengthwise portions of the footprint pins. Further, the free end for at least some of the footprint pins of the first grid and the second grid can be disposed between two vias arranged along the linear row in which each of the footprint pins is disposed.

Each of the first grid and the second grid of the electronic device can comprise four linear rows. For example, each linear row can include two pairs of transmitter (Tx) footprint pins that facilitate transmission of signals from the PCB to corresponding surface mount pins of the first surface mount connector or the second surface mount connector that connect with the transmitter (Tx) footprint pins, and each linear row can further include two pairs of receiver (Rx) footprint pins that facilitate receipt of signals from surface mount pins of the first surface mount connector or the second surface mount connector that connect with the receiver (Rx) footprint pins, where the free ends of the transmitter (Tx) footprint pins in each row extend in the first direction and the free ends of the receiver (Rx) footprint pins in each row extend in the second direction.

Each linear row of the first grid can be aligned with a corresponding linear row of the second grid, and each linear row of footprint pins of the first grid can be offset in a linear direction of the linear row by a footprint pin width in relation to the corresponding linear row of footprint pins of the second grid such that the first surface mount connector mounted to the top surface is offset in the linear direction from the second surface mount connector mounted to the bottom surface.

In a further example embodiment, a method comprises providing an electronic device including a printed circuit board (PCB), where the PCB comprises a first grid disposed at a top surface of the PCB and a second grid disposed at a bottom surface of the PCB, each of the first and second grids comprising a plurality of electrically conductive footprint pins and a plurality of vias, the plurality of footprint pins and plurality of vias being arranged along one or more linear rows at each of the first grid and the second grid. Each via can extend through the PCB to the top surface and the bottom surface of the PCB such that each via is part of the first grid and the second grid. Each footprint pin can be elongated and include a connecting end and a free end that opposes the connecting end. Each via can include a contact end that is located at one of the first grid and the second grid and is in electrical contact with the connecting end of one of the plurality of footprint pins, and each via can further include a non-contact end that is located at an other of the first grid and the second grid and is not in electrical contact with any of the plurality of footprint pins. Each linear row of the first grid and the second grid can include a first pair of the plurality of footprint pins and a second pair of the plurality of footprint pins, each of the first pair and the second pair including two footprint pins aligned adjacent to each other in the linear row. The free end of each footprint pin of the first pair can extend in a first direction along the PCB, the free end of each footprint pin of the second pair can extend in a second direction along the PCB, such that the first direction opposes the second direction by 180°. A first surface mount connector can be mounted to the top surface of the PCB such that surface mount pins of the first surface mount connector connect with footprint pins of the first grid, and a second surface mount connector can be mounted to the bottom surface of the PCB such that surface mount pins connect with footprint pins of the second grid.

In the method, each linear row can include two pairs of transmitter (Tx) footprint pins that facilitate transmission of signals from the PCB to corresponding surface mount pins of the first surface mount connector or second surface mount connector that connect with the transmitter (Tx) footprint pins, and each linear row can further include two pairs of receiver (Rx) footprint pins that facilitate receipt of signals from surface mount pins of the first surface mount connector or the second surface mount connector that connect with the receiver (Rx) footprint pins, where the free ends of the transmitter (Tx) footprint pins in each row extend in the first direction and the free ends of the receiver (Rx) footprint pins in each row extend in the second direction.

Each linear row of footprint pins of the first grid in the method can be aligned with a corresponding linear row of footprint pins of the second grid, and each linear row of footprint pins of the first grid can be offset in a linear direction of the linear row by a footprint pin width in relation to the corresponding linear row of footprint pins of the second grid such that the first surface mount connector mounted to the top surface is offset in the linear direction from the second surface mount connector mounted to the bottom surface.

The above description is intended by way of example only. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A printed circuit board (PCB) comprising:
a grid comprising a plurality of footprint pins and a plurality of vias, the plurality of footprint pins and the plurality of vias being arranged along one or more linear rows, each footprint pin being disposed at a top surface or a bottom surface of the PCB, and each via extending through the PCB to the top surface and the bottom surface of the PCB, wherein:
each footprint pin is elongated and includes a connecting end and a free end that opposes the connecting end;
each via includes a contact end that is located at one of the top surface and the bottom surface and is in electrical contact with the connecting end of one of the plurality of footprint pins, and each via further includes a non-contact end that is located at an other of the top surface and the bottom surface and is not in electrical contact with any of the plurality of footprint pins;
each linear row includes a first pair of the plurality of footprint pins and a second pair of the plurality of footprint pins, each of the first pair and the second pair including two footprint pins aligned adjacent to each other in the linear row; and
the free end of each footprint pin of the first pair extends in a first direction along the PCB, the free end of each footprint pin of the second pair extends in a second direction along the PCB, and the first direction opposes the second direction by 180°.

2. The PCB of claim 1, wherein the non-contact end of each via is backdrilled to a selected depth within the PCB.

3. The PCB of claim 1, wherein the free end of each footprint pin is tapered such that a first width dimension of the free end is smaller than a second width dimension along other lengthwise portions of the footprint pin.

4. The PCB of claim 1, wherein the free end for at least some of the footprint pins is disposed between two vias arranged along the linear row.

5. The PCB of claim 1, wherein the grid comprises four linear rows of footprint pins and vias.

6. The PCB of claim 5, wherein each linear row includes two pairs of transmitter (Tx) footprint pins that facilitate transmission of signals from the PCB to a surface mount connector that connects with the transmitter (Tx) footprint pins, and each linear row further includes two pairs of receiver (Rx) footprint pins that facilitate receipt of signals from the surface mount connector that connects with the receiver (Rx) footprint pins, wherein the free ends of the transmitter (Tx) footprint pins in each row extend in the first direction and the free ends of the receiver (Rx) footprint pins in each row extend in the second direction.

7. The PCB of claim 1, wherein the PCB includes a first grid disposed at the top surface of the PCB and a second grid disposed at the bottom surface of the PCB, the vias are located within the first grid and the second grid, each of the first grid and the second grid includes a plurality of linear rows of footprint pins and vias, and each linear row of the first grid is aligned with a corresponding linear row of the second grid.

8. The PCB of claim 7, wherein each linear row of footprint pins and vias of the first grid is offset in a linear direction of the linear row by a footprint pin width in relation to the corresponding linear row of the second grid.

9. The PCB of claim 1, wherein the PCB includes a plurality of layers with antipads located around vias within each layer, and a cross-sectional dimension of an antipad varies at different layers for at least one via.

10. The PCB of claim 9, wherein the antipad located at a contact end of the at least one via is greater in cross-sectional dimension in relation to the antipad located at the non-contact end of the at least one via.

11. An electronic device comprising:
a printed circuit board (PCB) comprising:
a first grid disposed at a top surface of the PCB and a second grid disposed at a bottom surface of the PCB, each of the first grid and the second grid comprising:
a plurality of footprint pins and a plurality of vias, the plurality of footprint pins and the plurality of vias being arranged along one or more linear rows at each of the first grid and the second grid, each via extending through the PCB to the top surface and the bottom surface of the PCB such that each via is part of the first grid and the second grid, wherein:
each footprint pin is elongated and includes a connecting end and a free end that opposes the connecting end;
each via includes a contact end that is located at one of the first grid and the second grid and is in electrical contact with the connecting end of one of the plurality of footprint pins, and each via further includes a non-contact end that is located at an other of the first grid and the second grid and is not in electrical contact with any of the plurality of footprint pins;
each linear row of the first grid and the second grid including a first pair of the plurality of footprint pins and a second pair of the plurality of footprint pins, each of the first pair and the second pair including two footprint pins aligned adjacent to each other in the linear row; and
the free end of each footprint pin of the first pair extends in a first direction along the PCB, the free end of each footprint pin of the second pair extends in a second direction along the PCB, and the first direction opposes the second direction by 180°;
a first surface mount connector mounted to the top surface of the PCB and including surface mount pins that connect with footprint pins of the first grid; and
a second surface mount connector mounted to the bottom surface of the PCB and including surface mount pins that connect with footprint pins of the second grid.

12. The electronic device of claim 11, wherein the non-contact end of each via for the first grid and the second grid is backdrilled to a selected depth within the PCB.

13. The electronic device of claim 12, wherein the free end of each footprint pin for the first grid and the second grid is tapered such that a first width dimension of the free end is smaller than a second width dimension along other lengthwise portions of the footprint pin.

14. The electronic device of claim 13, wherein the free end for at least some of the footprint pins of the first grid and the second grid is disposed between two vias arranged along the linear row in which each of the footprint pins is disposed.

15. The electronic device of claim 11, wherein each of the first grid and the second grid comprises four linear rows.

16. The electronic device of claim 15, wherein each linear row includes two pairs of transmitter (Tx) footprint pins that facilitate transmission of signals from the PCB to corresponding surface mount pins of the first surface mount connector or the second surface mount connector that connect with the transmitter (Tx) footprint pins, and each linear row further includes two pairs of receiver (Rx) footprint pins that facilitate receipt of signals from surface mount pins of the first surface mount connector or the second surface mount connector that connect with the receiver (Rx) footprint pins, wherein the free ends of the transmitter (Tx) footprint pins in each row extend in the first direction and the free ends of the receiver (Rx) footprint pins in each row extend in the second direction.

17. The electronic device of claim 15, wherein each linear row of footprint pins of the first grid is aligned with a corresponding linear row of footprint pins of the second grid, and each linear row of footprint pins of the first grid is offset in a linear direction of the linear row by a footprint pin width in relation to the corresponding linear row of footprint pins of the second grid such that the first surface mount connector mounted to the top surface is offset in the linear direction from the second surface mount connector mounted to the bottom surface.

18. A method comprising:
  providing an electronic device including a printed circuit board (PCB), the PCB comprising:
    a first grid disposed at a top surface of the PCB and a second grid disposed at a bottom surface of the PCB, each of the first and second grids comprising a plurality of footprint pins and a plurality of vias, the plurality of footprint pins and the plurality of vias being arranged in one or more linear rows at each of the first grid and the second grid, each via extending through the PCB to the top surface and the bottom surface of the PCB such that each via is part of the first grid and the second grid, wherein:
      each footprint pin is elongated and includes a connecting end and a free end that opposes the connecting end;
      each via includes a contact end that is located at one of the first grid and the second grid and is in electrical contact with the connecting end of one of the plurality of footprint pins, and each via further includes a non-contact end that is located at an other of the first grid and the second grid and is not in electrical contact with any of the plurality of footprint pins;
      each linear row of the first grid and the second grid including a first pair of the plurality of footprint pins and a second pair of the plurality of footprint pins, each of the first pair and the second pair including two footprint pins aligned adjacent to each other in the linear row; and
      the free end of each footprint pin of the first pair extends in a first direction along the PCB, the free end of each footprint pin of the second pair extends in a second direction along the PCB, and the first direction opposes the second direction by 180°;
    mounting a first surface mount connector to the top surface of the PCB such that surface mount pins of the first surface mount connector connect with footprint pins of the first grid; and
    mounting a second surface mount connector to the bottom surface of the PCB such that surface mount pins connect with footprint pins of the second grid.

19. The method of claim 18, wherein each linear row includes two pairs of transmitter (Tx) footprint pins that facilitate transmission of signals from the PCB to corresponding surface mount pins of the first surface mount connector or second surface mount connector that connect with the transmitter (Tx) footprint pins, and each linear row further includes two pairs of receiver (Rx) footprint pins that facilitate receipt of signals from surface mount pins of the first surface mount connector or the second surface mount connector that connect with the receiver (Rx) footprint pins, wherein the free ends of the transmitter (Tx) footprint pins in each row extend in the first direction and the free ends of the receiver (Rx) footprint pins in each row extend in the second direction.

20. The method of claim 18, wherein each linear row of footprint pins of the first grid is aligned with a corresponding linear row of footprint pins of the second grid, and each linear row of footprint pins of the first grid is offset in a linear direction of the linear row by a footprint pin width in relation to the corresponding linear row of footprint pins of the second grid such that the first surface mount connector mounted to the top surface is offset in the linear direction from the second surface mount connector mounted to the bottom surface.

* * * * *